United States Patent

Misawa et al.

Patent Number: 5,813,115
Date of Patent: Sep. 29, 1998

[54] METHOD OF MOUNTING A SEMICONDUCTOR CHIP ON A WIRING SUBSTRATE

[75] Inventors: Yoshihiko Misawa, Katano; Koichi Morita, Osaka; Keiji Saeki, Kobe; Setsuo Horimoto, Katano, all of Japan

[73] Assignee: Matsushita Electric Industrial Co., Ltd., Osaka-fu, Japan

[21] Appl. No.: 510,273

[22] Filed: Aug. 2, 1995

[30] Foreign Application Priority Data

Aug. 3, 1994 [JP] Japan .................................. 6-182021

[51] Int. Cl.⁶ .............................. H05K 3/30; H01R 43/16
[52] U.S. Cl. ................................ 29/832; 29/843; 29/844; 29/874; 228/4.5; 228/180.22
[58] Field of Search .............................. 29/832, 840, 842, 29/843, 854, 855, 856, 874; 228/179.1, 180.22, 4.5; 437/183, 209; 156/292

[56] References Cited

U.S. PATENT DOCUMENTS

| | | | |
|---|---|---|---|
| 3,646,670 | 3/1972 | Maeda et al. .............................. 29/843 |
| 4,661,192 | 4/1987 | McShane ............................ 228/180.22 |
| 4,914,814 | 4/1990 | Behun et al. .............................. 29/843 |
| 5,060,843 | 10/1991 | Yasuzato et al. ......................... 228/4.5 |
| 5,090,119 | 2/1992 | Tsuda et al. .............................. 29/843 |
| 5,172,851 | 12/1992 | Matsushita et al. ...................... 228/4.5 |

*Primary Examiner*—P. W. Echols
*Attorney, Agent, or Firm*—Wenderoth, Lind & Ponack, L.L.P.

[57] ABSTRACT

When a semiconductor chip is mounted on a wiring substrate, an end of a metallic wire fed through a capillary is first fused to form a ball, which is in turn pressed against and bonded to an electrode pad formed on a semiconductor chip. The metallic wire is then cut at a location in the proximity of the ball so that a portion of the metallic wire remains as a protruding contact on the ball. The protruding contact is pressed against a shaping platform coated with a paste-like electrically-conductive adhesive film to thereby cause the protruding contact to have a given height and transfer a portion of the adhesive film to the protruding contact. The protruding contact is eventually bonded to an electrically-conductive film formed on the wiring substrate via the transferred portion of the adhesive film.

2 Claims, 6 Drawing Sheets

METHOD OF MOUNTING A SEMICONDUCTOR CHIP ON A WIRING SUBSTRATE

BACKGROUND OF THE INVENTION

1. Field of the Invention

The present invention relates to a method of mounting a semiconductor chip on a wiring substrate via an electrically-conductive adhesive layer or a solder layer.

2. Description of Related Art

Conventionally, a semiconductor chip is generally mounted on a wiring substrate via an electrically-conductive adhesive layer.

Japanese Patent Publication (examined) No. 6-3820 discloses a semiconductor chip mounting method as shown in FIGS. 6 to 10. According to this method, an end of an Au wire 2, fed through a capillary 1, is first fused to form a ball 3, which is in turn bonded to an electrode pad 5 formed on a semiconductor chip 4 by thermocompression bonding or ultrasonic welding. Thereafter, the capillary 1 is moved relative to the semiconductor chip 4 generally in parallel thereto, as shown in FIG. 7, so that an inverted U-shaped bent portion 2a may be formed immediately above the ball 3. The Au wire 2 is then cut with the bent portion 2a left on the ball 3.

After a protruding contact 6 made up of the ball 3 and the bent portion 2a has been formed on each of a plurality of electrode pads 5 of the semiconductor chip 4, all the protruding contacts 6 are pressed against a generally flat and fine surface 7a of a shaping platform 7 with the protruding contacts 6 directed downwardly, as shown in FIG. 8, to thereby make the height of the protruding contacts 6 substantially constant and flatten tops thereof.

In a process shown in FIG. 9, all the protruding contacts 6 having a substantially identical height and each having a generally flat top surface are coated with a paste-like film of an electrically-conductive adhesive using a transfer method. More specifically, as shown in FIG. 9, all the protruding contacts 6 are brought into contact with that surface of a transfer platform 8 on which an electrically-conductive adhesive film 9 containing a binder made primarily of an epoxy-based resin is uniformly coated.

Thereafter, as shown in FIG. 10, all the protruding contacts 6 on the semiconductor chip 4 are aligned with associated electrically-conductive films 11 formed into a pattern on a wiring substrate 10, and are bonded thereto via respective films 9a coated on the protruding contacts 6. The films 9a are eventually thermoset by heating them.

However, the above-described semiconductor chip mounting method requires at least four processes including a process of forming a protruding contact on each of a plurality of electrode pads, a process of shaping the protruding contacts, a process of transferring an adhesive to the protruding contacts, and a process of anchoring the protruding contacts on a wiring substrate. Furthermore, it is necessary not only to adsorb and hold the semiconductor chip for movement thereof to each process using, for example, an adsorption collet, but also to appropriately position the semiconductor chip in each process, thus extending a production line and reducing the production efficiency or the yield as a whole.

SUMMARY OF THE INVENTION

The present invention has been developed to overcome the above-described disadvantages.

It is accordingly an objective of the present invention to provide a semiconductor chip mounting method capable of shortening the overall length of a production line by reducing the number of processes, to thereby enhance the production efficiency.

In accomplishing the above and other objectives, the method according to one form of the present invention comprises the steps of: (a) feeding a metallic wire through a capillary; (b) fusing an end of the metallic wire to form a ball; (c) pressing and bonding the ball against and to an electrode pad formed on the semiconductor chip; (d) cutting the metallic wire at a location in the proximity of the ball so that a portion of the metallic wire remains as a protruding contact on the ball; (e) pressing the protruding contact against a fine surface of a shaping platform coated with a paste-like electrically-conductive adhesive film to thereby cause the protruding contact to have a given height and transfer a portion of the adhesive film to the protruding contact; and (f) bonding the protruding contact to an electrically-conductive film formed on the wiring substrate via the transferred portion of the adhesive film.

Because the portion of the adhesive film is transferred to the protruding contact in the process of making the protruding contact have the given height, a process of shaping the protruding contact and that of transferring the adhesive are carried out simultaneously, thus making it possible to shorten a production line and enhance the production efficiency.

In another form of the present invention, the steps (e) and (f) referred to above are replaced with (g) pressing the protruding contact against an electrically-conductive film formed on the wiring substrate and coated with a solder layer; and (h) heating the solder layer to bond the protruding contact to the electrically-conductive film.

Because the protruding contact is directly soldered to the electrically-conductive film on the wiring substrate, neither the shaping process nor the adhesive transfer process is required and, hence, the production line can be shortened to enhance the production efficiency.

BRIEF DESCRIPTION OF THE DRAWINGS

The above and other objectives and features of the present invention will become more apparent from the following description of preferred embodiments thereof with reference to the accompanying drawings, throughout which like parts are designated by like reference numerals, and wherein.

DETAILED DESCRIPTION OF THE PREFERRED EMBODIMENTS

Figure 1:
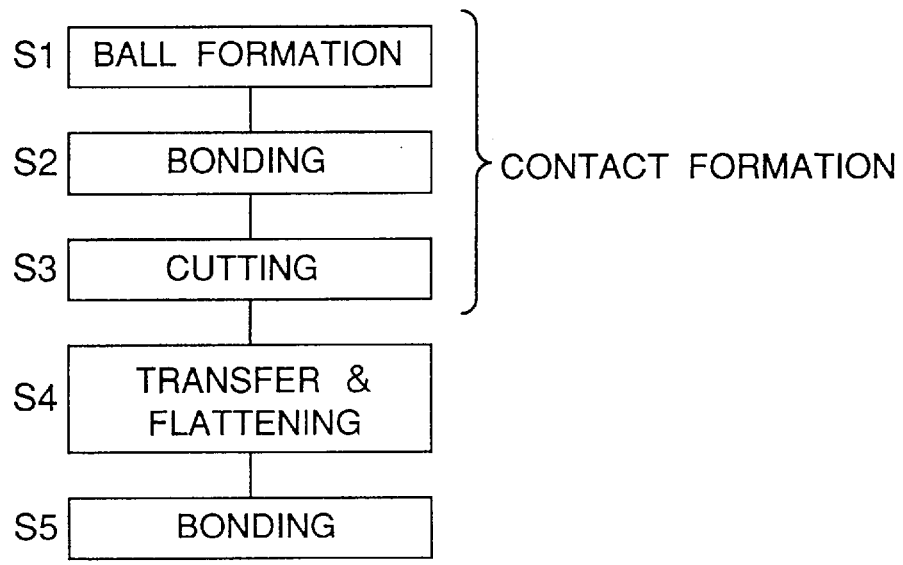
FIG. 1 is a flow-chart indicating a semiconductor chip mounting method according to a first embodiment of the present invention.

Referring now to the drawings, there is shown in FIG. 1 a flow-chart indicating a semiconductor chip mounting method according to a first embodiment of the present invention.

Figure 2A:
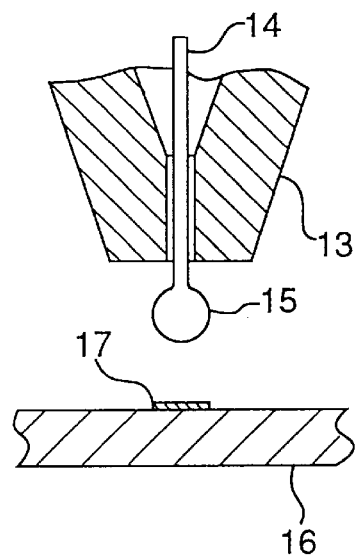
FIGS. 2A, 2B, 2C, 2D, and 2E are vertical elevational views, partly in section, of a semiconductor chip and the like indicating a plurality of processes shown in FIG. 1.

At step S1, a metallic wire 14 is first fed through a capillary 13, and an end thereof is fused by electrical discharges to form a ball 15, as shown in FIG. 2A.

Figure 2B:
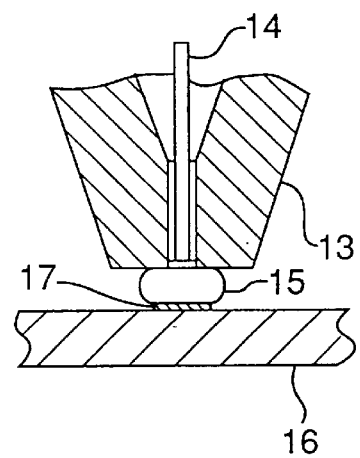

At step S2, the ball 15 is pressed against an electrode pad 17 formed on a semiconductor chip 16 and is bonded thereto by thermocompression bonding or ultrasonic welding, as shown in FIG. 2B.

Figure 2C:
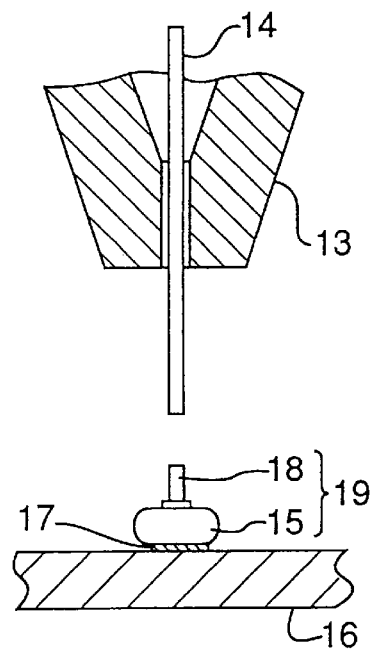

At step S3 shown in FIG. 2C, the metallic wire 14 is cut at a location in the proximity of the ball 15 by moving the capillary 13 together with the metallic wire 14 vertically upwardly, to thereby form on the electrode pad 17 a protruding contact 19 having a height of about 60 $\mu$m and made up of the ball 15 and a metallic wire portion 18 having a length of 30 to 40 $\mu$m extending upwardly therefrom. The metallic wire 14 has a high modulus of elasticity and a low thermal conductivity to ensure cutting at a desired position thereof.

Figure 2D:
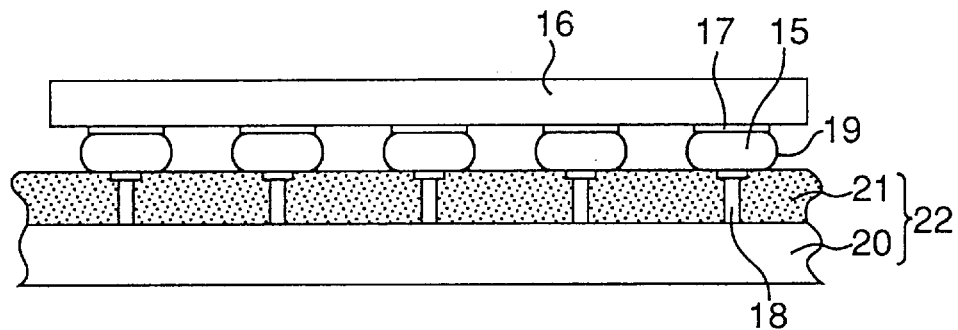

After such a protruding contact 19 has been formed on each of a plurality of electrode pads 17 on the semiconductor chip 16, the semiconductor chip 16 is transferred to a shaping and adhesive transfer process shown in FIG. 2D, with the protruding contacts 19 directed downwardly (step S4). In this process, a unit 22 having a glass-made shaping platform 20 and a paste-like electrically-conductive adhesive film 21 coated thereon and having a thickness of 20 to 25 $\mu$m is used. The semiconductor chip 16 is moved towards the unit 22 so that tops of the metallic wire portions 18 may be pressed against the shaping platform 20. Because the shaping platform 20 has a generally flat and fine surface having unevenness less than 0.2 $\mu$m, all the protruding contacts 19 are made substantially constant in height and, at the same time, a portion of the paste-like adhesive film 21 is transferred to each protruding contact 19.

It is to be noted here that the shaping platform 20 is not limited to the glass plate, but may be a metallic plate coated with carbide titanium having a good releasability.

When the metallic wire portions 18 are pressed against the shaping platform 20, it is preferable to vary the pressure applied to the metallic wire portions 18 by mechanically vibrating at least one of the semiconductor chip 16 and the shaping platform 20. By so doing, not only all the protruding contacts 19 can be made substantially constant in height with high accuracy, but also they can be uniformly coated with a paste-like electrically-conductive adhesive 21a.

Figure 2E:
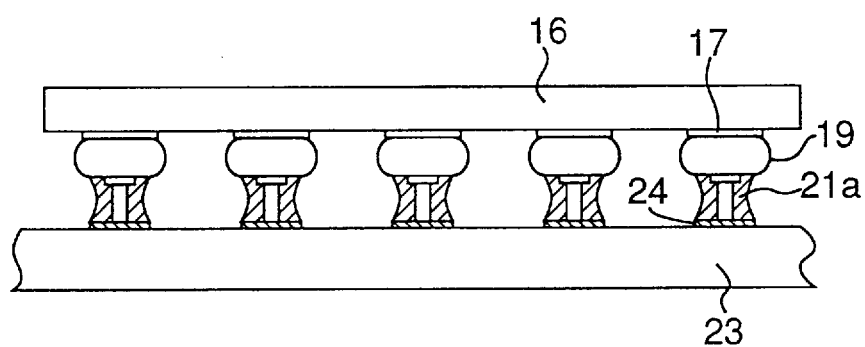

At step S5 shown in FIG. 2E, the protruding contacts 19, which have already undergone the shaping and adhesive transfer process, are aligned with and bonded to associated electrically-conductive films 24 formed into a pattern on a wiring substrate 23. After the bonding, the paste-like electrically-conductive adhesive 21a is thermoset by heating it.

Figure 3:
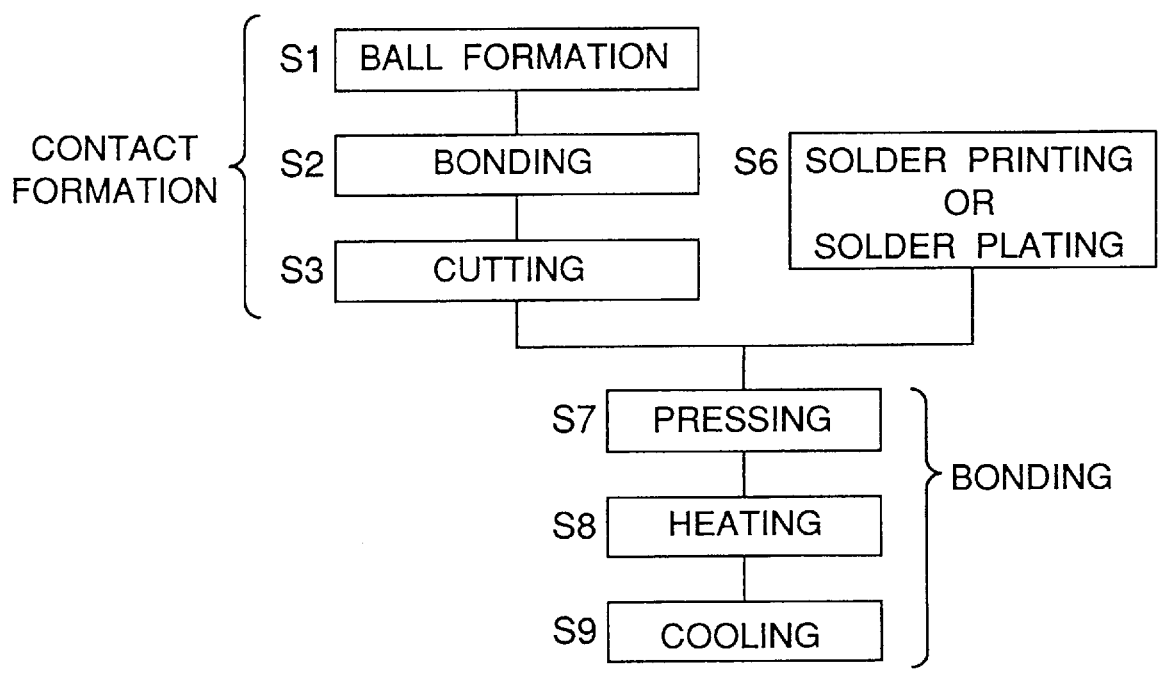
FIG. 3 is a flow-chart indicating a semiconductor chip mounting method according to a second embodiment of the present invention.

FIG. 3 depicts a flow-chart indicating a semiconductor chip mounting method according to a second embodiment of the present invention, in which the protruding contacts 19 obtained at steps S1 to S3 are bonded to the associated electrically-conductive films 24 on the wiring substrate 23 via respective solder layers.

Figure 4:
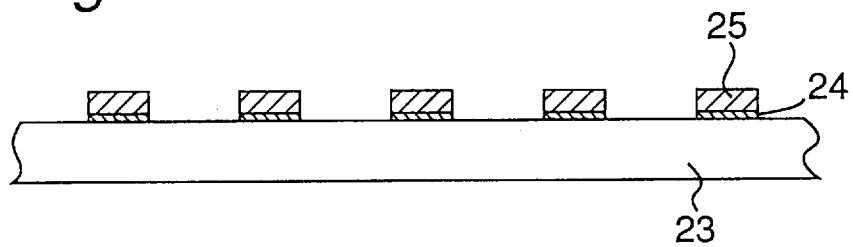
FIG. 4 is a vertical elevational view, partly in section, of a wiring substrate employed in the method shown in FIG. 3.

More specifically, at step S6, a solder/paste layer 25 is formed on each of the electrically-conductive films 24 using a screen process printing technique, a plating technique or the like, as shown in FIG. 4.

Figure 5:
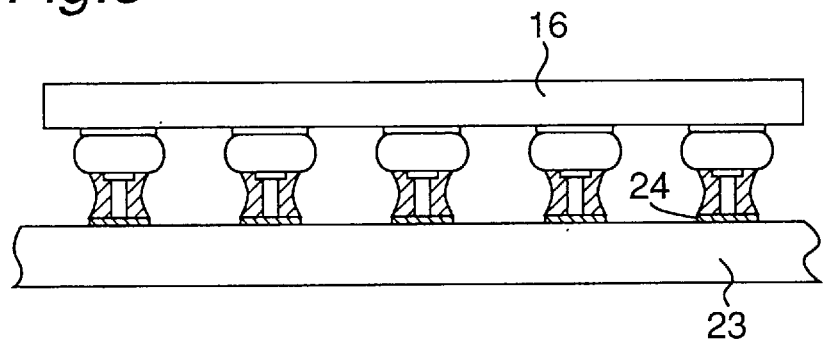
FIG. 5 is a view similar to FIG. 2E, but according to the second embodiment of the present invention.
Figure 6:
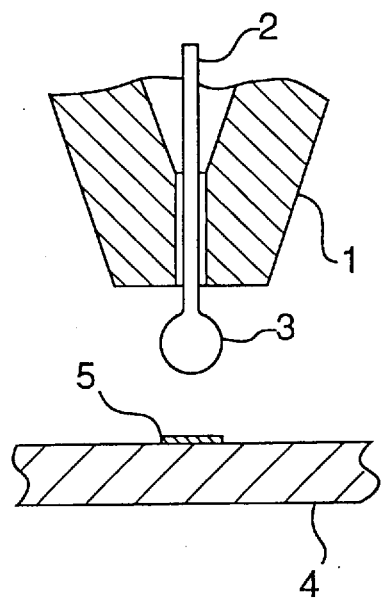
FIG. 6 is a vertical sectional view of a capillary positioned relative to a semiconductor chip during a ball forming process in a conventional semiconductor chip mounting method.
Figure 7:
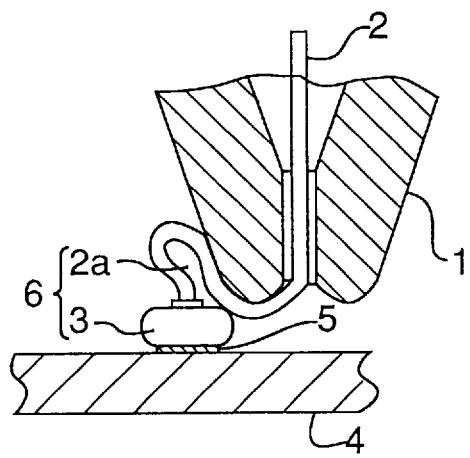
FIG. 7 is a vertical sectional view of the capillary positioned relative to the semiconductor chip during a process of forming an inverted U-shaped bent portion in the conventional semiconductor chip mounting method.
Figure 8:
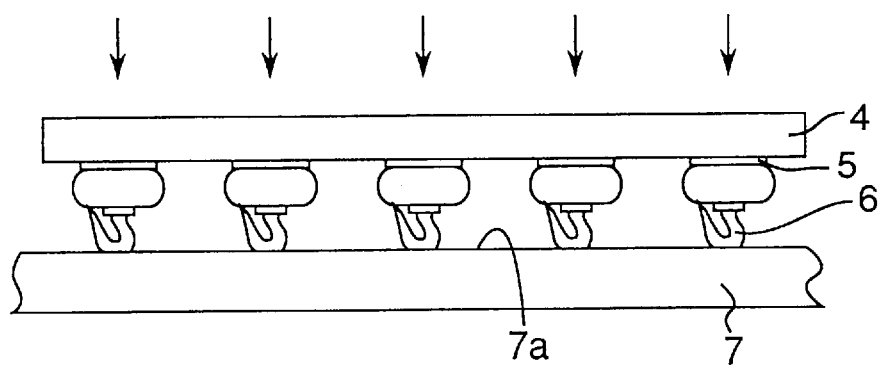
FIG. 8 is a vertical elevational view of the semiconductor chip positioned relative to a shaping platform during a flattening process in the conventional semiconductor chip mounting method.
Figure 9:
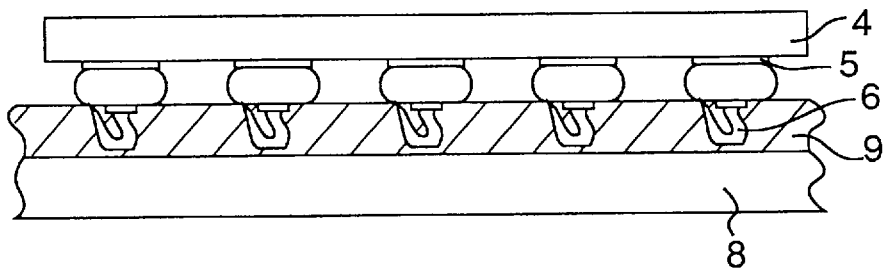
FIG. 9 is a vertical elevational view of the semiconductor chip positioned relative to a transfer platform during an adhesive transforming process in the conventional semiconductor chip mounting method.
Figure 10:
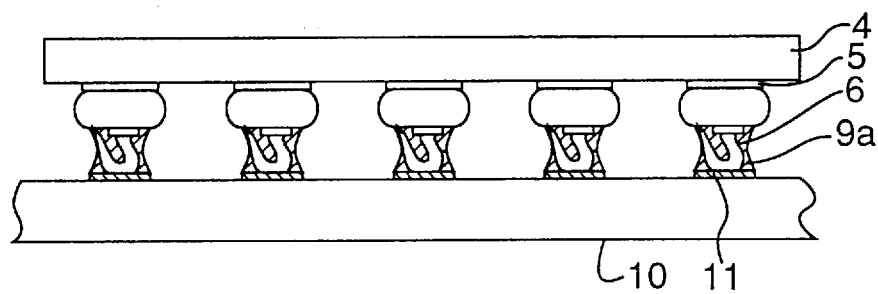
FIG. 10 is a vertical elevational view of the semiconductor chip relative to a wiring substrate during a bonding process in the conventional semiconductor chip mounting method.

As shown in FIG. 5, upon positioning of the protruding contacts 19 on associated solder/paste layers 25, the semiconductor chip 16 is moved towards the wiring substrate 23 so that tops of the metallic wire portions 18 may be pressed against the associated electrically-conductive films 24 (step S7). Then, the metallic wire portions 18 are bonded to the electrically-conductive films 24 by heating and fusing the solder/paste layers 25 (step S8). Thereafter, the heated and fused solder/paste layers 25 are cooled (step S9).

It is to be noted here that the solder/paste layers 25 may be solder-deposited layers.

As described hereinabove, according to the present invention, because the processes required for mounting a semiconductor chip on a wiring substrate are rationalized, it is possible to shorten a production line, thus enhancing the production efficiency.

Although the present invention has been fully described by way of examples with reference to the accompanying drawings, it is to be noted here that various changes and modifications will be apparent to those skilled in the art. Therefore, unless such changes and modifications otherwise depart from the spirit and scope of the present invention, they should be construed as being included therein.

What is claimed is:

1. A method of mounting a semiconductor chip on a wiring substrate, which comprises the steps of:

feeding a metallic wire through a capillary;

fusing an end of the metallic wire to form a ball;

pressing and bonding the ball against and to an electrode pad formed on the semiconductor chip;

cutting the metallic wire at a location in the proximity of the ball so that a portion of the metallic wire remains as a protruding contact on the ball;

repeating said steps of feeding, fusing, pressing and cutting to form a plurality of protruding contacts;

pressing the protruding contacts against a fine surface of a shaping platform coated with a paste-like electrically-conductive adhesive film to thereby cause the protruding contacts to have a given height and transfer a portion of the adhesive film to the protruding contacts; and bonding each of the protruding contacts to an electrically-conductive film formed on the wiring substrate via the transferred portion of the adhesive film.

2. The method according to claim 1, wherein said step of cutting the metallic wire is performed so that the portion of the metallic wire that remains as a protruding contact on the ball extends generally straight away from the electrode pad.

* * * * *